US006348718B1

(12) United States Patent
Leipold et al.

(10) Patent No.: US 6,348,718 B1
(45) Date of Patent: Feb. 19, 2002

(54) INTEGRATED CMOS CIRCUIT FOR USE AT HIGH FREQUENCIES

(75) Inventors: Dirk Robert Walter Leipold, Landshut; Wolfgang Heinz Schwartz, Ergolding; Karl-Heinz Kraus, Freising, all of (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/312,511

(22) Filed: May 14, 1999

(30) Foreign Application Priority Data

May 14, 1998 (DE) .......................... 198 21 726

(51) Int. Cl.[7] .................. H01L 27/11; H01L 23/62; G11C 11/00
(52) U.S. Cl. .................. 257/379; 257/528; 257/531; 257/532; 257/533; 257/516; 257/350; 257/499; 257/380; 257/369; 257/359
(58) Field of Search .................. 257/528, 531, 257/532, 533, 516, 379, 350, 380, 386, 372, 369, 358, 359, 368, 499

(56) References Cited

U.S. PATENT DOCUMENTS

| | | | | |
|---|---|---|---|---|
| 4,929,570 A | * | 5/1990 | Howell | |
| 5,021,859 A | * | 6/1991 | Ito et al. | |
| 5,168,341 A | * | 12/1992 | Kumagai | 257/370 |
| 5,286,991 A | * | 2/1994 | Hui et al. | 257/306 |
| 5,366,907 A | * | 11/1994 | Sasaki | |
| 5,559,349 A | * | 9/1996 | Cricchi et al. | 257/539 |
| 5,578,860 A | * | 11/1996 | Costa et al. | 257/528 |
| 5,622,887 A | * | 4/1997 | Miwa et al. | 438/202 |
| 5,780,910 A | * | 7/1998 | Hashimoto et al. | 257/379 |
| 5,788,854 A | * | 8/1998 | Desigoudar et al. | 216/13 |
| 6,110,772 A | * | 8/2000 | Takada et al. | 438/238 |

* cited by examiner

Primary Examiner—Alexander O. Williams
(74) Attorney, Agent, or Firm—Pedro P. Hernandez; W. James Brady, III; Frederick J. Telecky, Jr.

(57) ABSTRACT

The invention relates to an integrated CMOS circuit for use at high frequencies with active CMOS components (12) and passive components (16, 18, 20). The active CMOS components (12) are formed in a semiconductor substrate (10) which has a specific resistivity in the order of magnitude of kΩcm. In the semiconductor substrate (10), and under the active CMOS components (12), a buried layer (22) is formed which has a specific resistivity in the order of magnitude of Ωcm. The passive components (16, 18, 20) are formed in or on a layer (14) of insulating material which is arranged on the semiconductor substrate (10). A conducting contact layer (24) is arranged on that surface of the semiconductor substrate (10) which is not facing the layer (14) of insulating material.

7 Claims, 1 Drawing Sheet

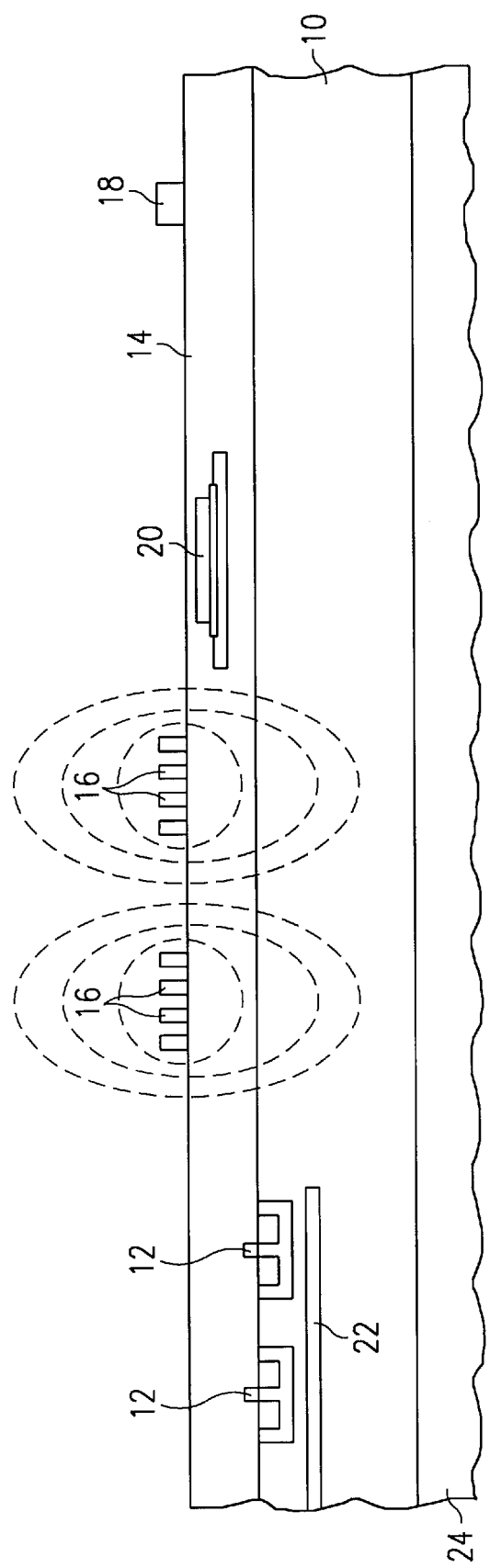

INTEGRATED CMOS CIRCUIT FOR USE AT HIGH FREQUENCIES

The invention relates to an integrated CMOS circuit for use at high frequencies with active CMOS components and passive components.

Integrated CMOS circuits produced by present-day conventional processes suffer from the disadvantage that the passive components required in the circuit, such as coils and capacitors, have a low Q-factor when used in typical high frequency applications such as input stages for symmetrical mixers or impedance transformers. This low Q-factor is attributable to undesirable capacitive coupling, and to the generation of eddy currents flowing in the conducting semiconductor substrate, made possible by the great number of charge carriers existing in such a semiconductor substrate.

Passive components with a low Q-factor are not desirable in high frequency circuits, since they require the use of additional active stages, in order to compensate for the energy losses caused on account of the low Q-factor. In addition to this, the use of components with a low Q-factor results in increased noise figures. However, and in particular in the case of CMOS circuits, the use of passive components is unavoidable because the CMOS components present a strictly capacitive input impedance, so that normally a coil with a high inductivity must be used, for the purpose of impedance matching, which acts in series-resonance with the input capacitance of the MOS transistor. In such a typical application, in particular, the low Q-factor with which the coil can be produced, is of great disadvantage.

The aim of the invention is to provide an integrated CMOS circuit for use at high frequencies, wherein passive components with a high Q-factor can be produced by a simple and cost-effective process.

In accordance with the invention, this aim is achieved in that the active CMOS components are formed in a semiconductor substrate which has a specific resistivity in the order of magnitude of kΩcm, that a buried layer is arranged under the active CMOS components in the semiconductor substrate, which has a specific resistivity in the order of magnitude of Ωcm, that the passive components are arranged in or on a layer of insulating material deposited on the semiconductor substrate, and that a conducting contact layer is provided on the surface of the semiconductor substrate not facing the layer of insulating material.

The integrated CMOS circuit according to the invention is formed in a high-resistance substrate with a conductive contact layer on the other side. The buried conductive layer created under the CMOS components, that is the active components of the circuit, prevents undesirable latch-up effects caused by any parasitic thyristor action. This conductive buried layer does not exist under the passive components, to prevent this from being the cause of coupling with neighboring components. It is no longer possible for eddy currents, induced by the passive components, to be created to a significant degree, as the required charge carriers are bled off through the conductive contact layer.

Advantageous further embodiments of the invention are indicated in the sub-claims.

An embodiment of the invention will now be explained with reference to the only FIGURE of the drawing, which shows a schematic sectional view of a semiconductor substrate with an integrated CMOS circuit for use at high frequencies.

The semiconductor component 10, shown in the drawing, may consist of silicon, germanium, some other semi-conducting material, or even of a compound semiconductor such as GaAs. It must, however, be a material of high resistivity in the order of magnitude of kΩcm.

Active components, such as n-channel field effect transistors and p-channel field effect transistors, are formed in the upper surface of the semiconductor substrate 10 by means of conventional processes. Two of these field effect transistors are shown schematically under item 12 in the illustration. These active components are connected by connector paths, not shown here, to create the desired CMOS circuit.

On top of the substrate 10 there is an insulating layer 14 on whose surface are formed passive components. The turns of a coil 16, as well as a conductor 18 of a micro strip line are shown as examples. Broken lines at the coil represent the field lines of a magnetic field caused by the coil, which may induce eddy currents in the semiconductor substrate 10. As a further example of a passive component, a capacitor 20 is formed in the layer 14. The insulating layer 14 may consist, for example of silicon dioxide or silicon nitride.

It should be mentioned that the active and passive components only represent examples of components which are used in conventional high frequency circuits. It is obvious that other components may be included in the circuit, such as Schottky diodes, tunnel diodes or similar devices.

A conducting layer 22 is buried in the high-Ohm semiconductor substrate 10 under the active components. This layer prevents any latch-up effect, that is the triggering of a parasitic thyristor forming under the active components, while certain potential conditions prevail.

On account of the high specific resistivity of the substrate 10, the problem of capacitive coupling and the generation of eddy currents in the substrate can only occur to a very limited extent, so that the passive components attain a high Q-factor. A contact layer 24 on the back of the semiconductor substrate 10 makes certain that the residual eddy currents induced in the semiconductor substrate are bled away, so that they cannot influence the behavior of other components included in the circuit.

The semiconductor substrate 10 may consist of either an n-type or a p-type semiconductor material. In the case of an n-type material, the p-type trough, in which the n-channel FETs are normally created, may be set at any desired potential. This proves advantageous with RF amplifiers in common gate configuration.

The buried conductive layer 22 may be created by implantation, by selective epitaxial growth deposition or by a combination of both processes. It may be of the same conduction type as the substrate or of the opposite conduction type to the substrate. It must, however, always have a markedly lower specific resistivity than the substrate; this is normally in the order of magnitude of Ωcm.

The conductive contact layer 24 on the back of substrate 10 may consist of a semiconductor material of the same conduction type as the substrate 10. The advantage of this is that all free charge carriers occurring in the substrate 10 can be bled away. It is, however, also possible to form a contact layer 24 which is of a conduction type opposed to that of the substrate 10. In such a case, a barrier depletion layer is created between the substrate 10 and the contact layer 24. It may be arranged that this barrier layer creates a space charge region large enough to starve the entire substrate 10 of charge carriers, which will have a favorable effect as regards the RF behavior of the passive components. In the case of an n-type substrate 10, the contact layer 24 of the circuit is connected to the positive supply line, when in operation, so ensuring that the free electrons occurring in the substrate 10 are bled away. In the case of a p-type substrate 10, the contact layer 24 is grounded for the purpose of bleeding away any free positive charges.

The conducting contact layer 24 may also consist of a metal.

In an embodiment of a CMOS circuit as described, Schottky diodes with a very low stray capacity may be created. It is therefore extremely advantageous to use these diodes as part of RF switching devices and bridge mixers. Furthermore, high quality impedance transformers may be produced, since the coils have the required high Q-factor. It is also easy to produce tunnel diodes, which may be used as third order frequency multipliers.

In practice, a CMOS circuit with RF components in a silicon substrate with a specific resistivity of approximately 5 kΩcm, and a buried layer with a specific resistivity of approximately 0.1 Acm was made up. Silicon material with a specific resistivity of approximately 0.01 Ωcm was used for the contact layer 18. In such a circuit, coils with a Q-factor of 30 and capacitors with a Q-factor of 60 have been behavior realised at a frequency of 2 GHz.

Such a circuit is particularly suited to be used in a combination with a digital signal processor (DSP) on the same chip, because the same manufacturing process can be used for both parts of the circuit, that is to say the analogue RF section and the digital signal processing section. Combination circuits of this type find their use mainly in telecommunications devices.

What is claimed is:

1. Integrated CMOS circuit for the use at high frequencies, with active CMOS components and with passive components, wherein the active CMOS components (12) are formed in a semiconductor substrate (10) which has a specific resistivity, wherein a conducting layer (22) is buried in and surrounded by the semiconductor substrate (10) under the active CMOS components (12), which has a specific resistivity of around three times the order of magnitude lower than the resistivity of the semiconductor substrate (10), wherein the passive components (16, 18, 20) are attached to a layer (14) of insulating material arranged on the semiconductor substrate (10), and wherein a conducting contact layer (24) is formed on the surface of the semiconductor substrate (10) facing away from the layer (14) made of an insulating material.

2. Integrated CMOS circuit according to claim 1, wherein the semiconductor substrate (10) is of either the p or n type and where the buried layer (22) is made of either the same or the opposite conduction type material as the semiconductor substrate (10).

3. Integrated CMOS circuit according to claim 1, wherein the conducting contact layer (24) is a metal layer.

4. Integrated CMOS circuit according to claim 1, wherein the conducting contact layer (24) is a doped semiconductor layer which is of the same or of the opposite conduction type material as the semiconductor substrate (10).

5. Integrated CMOS circuit according to claim 1, wherein the layer (14) of insulating material consists of silicon dioxide.

6. Integrated CMOS circuit according to claim 1, wherein the layer (14) of insulating material consists of silicon nitride.

7. Integrated CMOS circuit according to claim 1, wherein the conducting layer (22) is not located underneath the passive components.

* * * * *